United States Patent [19]

Tanabe et al.

[11] 4,173,900
[45] Nov. 13, 1979

[54] SEMICONDUCTOR PRESSURE TRANSDUCER

[75] Inventors: Masanori Tanabe; Satoshi Shimada, both of Hitachi; Motohisa Nishihara, Katsuta; Kazuji Yamada, Hitachi; Yasumasa Matsuda, Hitachi; Michitaka Shimazoe, Hitachi; Yoshitaka Matsuoka, Mito; Yukio Takahashi, Katsuta; Katsuya Katohgi, Katsuta; Mitsuo Ai, Katsuta, all of Japan

[73] Assignee: Hitachi, Ltd., Japan

[21] Appl. No.: 883,589

[22] Filed: Mar. 6, 1978

[30] Foreign Application Priority Data

| Mar. 7, 1977 [JP] | Japan | 52/25045 |
| Mar. 7, 1977 [JP] | Japan | 52/25046 |
| Mar. 17, 1977 [JP] | Japan | 52/29678 |

[51] Int. Cl.² ............................................. G01L 9/06
[52] U.S. Cl. ................................ 73/727; 73/721; 73/777; 338/4; 338/42
[58] Field of Search ................. 73/88.5 SD, 721, 727, 73/723, 777; 338/4, 42

[56] References Cited

U.S. PATENT DOCUMENTS

| 3,537,319 | 11/1970 | Yerman | 73/727 |
| 3,820,401 | 6/1974 | Lewis | 73/727 |

*Primary Examiner*—Donald O. Woodiel
*Attorney, Agent, or Firm*—Craig and Antonelli

[57] ABSTRACT

A semiconductor pressure transducer comprising a disc-shaped pressure-responsive diaphragm; a pair of radial strain gauge units having a piezoresistance effect, formed by injecting an impurity in the radial direction in the surface of the diaphragm; and a pair of tangential strain gauge units having a piezoresistance effect, formed by injecting an impurity in the tangential direction in the surface of the diaphragm, wherein the distance from the pair of the radial strain gauge units to the center of the circular diaphragm is greater than the distance from the pair of the tangential strain gauge units to the center of the circular diaphragm.

8 Claims, 7 Drawing Figures

SEMICONDUCTOR PRESSURE TRANSDUCER

BACKGROUND OF THE INVENTION

1. Field of the Invention

This invention relates to a semiconductor pressure transducer comprising strain gauges having piezoresistance effect, formed integrally by injecting an impurity into the surface of a diaphragm made of a single crystal of semiconductor such as silicon.

2. Description of the Prior Art

A currently used semiconductor pressure transducer using a diaphragm of, for example, single crystal silicon has such a structure that the diaphragm is made to have a supporting portion and a pressure-responsive portion and strain gauge units are formed at selected positions in the surface of the pressure-responsive portion through diffusion technique. These strain gauge units are connected in the Wheatstone bridge circuit. Such a semiconductor pressure transducer can effectively convert a strain generated in the surface of the diaphragm into an electrical signal. This performance of the silicon diaphragm is based on the piezoresistance effect of the semiconductor. The semiconductor pressure transducer is superior to the strain gauge using metal conductor in sensitivity to a physical quantity which is applied to produce a strain therein and finally converted into an electrical output, but defective in that it gives greater non-linear output characteristics in conversion.

The "non-linearity" is defined as follows. Assuming that on an output characteristic curve representing the relationship between a pressure applied to the diaphragm and an output of the strain gauge unit due to the pressure, the output corresponding to zero pressure is given at a point $V_o$ and the output corresponding to a measurable maximum pressure is given at a point $V_{max}$, the straight line connecting the point $V_o$ to the point $V_{max}$ will represent an output of an ideal strain gauge unit which exhibits a linear output characteristic. If the maximum value of the output difference between the output characteristic curve and the straight line is given by $\Delta V$, the non-linearity NL is given by an expression:

$$NL = \Delta V / V_{max} - V_o \times 100\% \ldots (1)$$

U.S. Pat. No. 4,050,313 discloses a semiconductor pressure transducer which is arranged to compensate for such nonlinearity. However, it has been found that the arrangement of the U.S. patent is unsatisfactory when the ambient temperature changes, since the ambient temperature affects the non-linearity as well as the output.

SUMMARY OF THE INVENTION

The object of this invention is to provide a semiconductor pressure transducer capable of compensating for the affect of the ambient temperature change on the non-linearity.

The inventors of the present application have ascertained by experimental study that if the position of the tangential strain gauge units is selected in a manner as mentioned below while the radial strain gauge units are disposed at certain positions in the peripheral portion of the diaphragm, it is possible to compensate for the non-linearity due to change in the ambient temperature.

Basically, the distance $X_T$ from the center of the diaphragm to the position of the tangential strain gauge unit is selected to be smaller than the distance $X_R$ from the diaphragm center to the position of the radial strain gauge unit which is disposed in the peripheral portion of the diaphragm. By the terms "peripheral portion" is indicated an area which is more than half of the radius of the diaphragm away from the center thereof.

Further, the non-linearity, as defined before, is a function of the position where the tangential strain gauge is disposed in the diaphragm. If the curve representing the relationship between the non-linearity and the distance from the center of the diaphragm to the position of the gauge shows that the non-linearity is zero at a certain point on the curve, the optimum position of the tangential strain gauge unit is corresponding to the point where the non-linearity is zero. If there exist two points on the curve where the non-linearity is zero, the optimum position is corresponding to one of the two points which is nearer to the center of the diaphragm than the other.

The present invention is aimed at compensation for non-linearity of a semiconductor strain gauge assembly depending on variation of the ambient temperature by selecting the positions of strain gauge units disposed in a diaphragm.

Other objects, features and advantages of this invention will be apparent from the following description.

DESCRIPTION OF THE PREFERRED EMBODIMENTS

Figure 1:
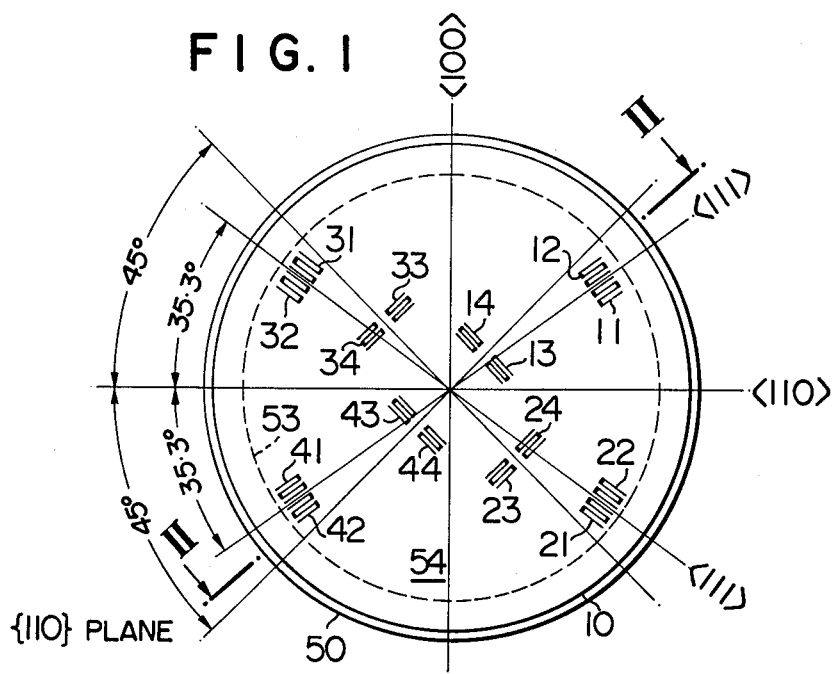
FIG. 1 shows the arrangement of semiconductor strain gauge units according to a first embodiment of this invention.
Figure 2:
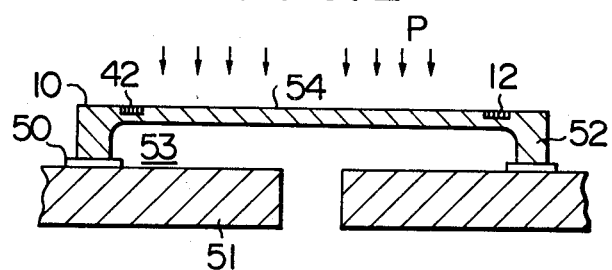
FIG. 2 is a cross section taken along line II—II in FIG. 1.

FIG. 1 shows in plan a semiconductor pressure transducer as a first embodiment of this invention, illustrating how the strain gauges are disposed on the disc-shaped diaphragm. FIG. 2 is a cross-section taken along line II—II in FIG. 1, in which the same reference numerals indicate like elements as in FIG. 1.

In FIG. 1, a disk shaped diaphragm 10 is made of n-type single crystal silicon and the surface of the diaphragm coincides with a {110} crystal plane. Pairs of radial strain gauge units 11 and 12, 21 and 22, 31 and 32, and 41 and 42 are formed respectively in the radial directions along a <111> crystal axis on the {110} plane, the radial strain gauge units being formed through the selective diffusion of an impurity such as boron. Pairs of tangential strain gauge units 13 and 14, 23 and 24, 33 and 34, and 43 and 44, formed through the same diffusion technique as above, are disposed in perpendicular to the axial directions making an angle of 45° with both crystal axes <110> and <100>. The radial strain gauge units are formed at a greater radial distance from the center of the circular diaphragm 10 than the tangential strain gauge units. The radial strain gauge units 11, 12, 21, 22, 31, 32, 41 and 42 are located in a peripheral portion of the diaphragm surface preferably at an area where the stress is maximum. As seen in FIG. 1, the radial distance from the center of the circular diaphragm to the tangential strain gauge units 13, 14, 43 and 44 is different from that from the center to the tangential strain gauge units 23, 24, 33 and 34, but these may be equal.

Figure 3:
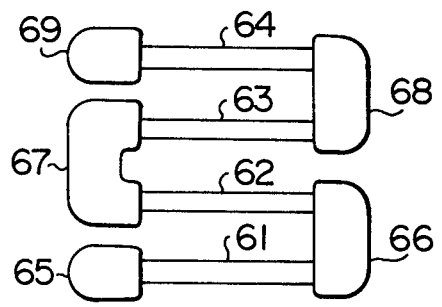
FIG. 3 shows an enlarged scale a radial strain gauge unit or a tangential strain gauge unit used in the embodiment of this invention.

FIG. 3 shows on magnified scale the details of a radial strain gauge unit or a tangential strain gauge unit. The radial strain gauge unit is the same in structure as the tangential strain gauge unit, and made of parallel strip portions 61, 62, 63 and 64 and low-resistance connection portions 65, 66, 67, 68 and 69 for connecting the parallel strip portions in series, as shown in FIG. 3. The shape of the strain gauge units is not limited to that shown in FIG. 3, but, for example, only one strip portion 61 may serve as a strain gauge unit.

As seen in FIG. 2, the rear side of the disc-shaped diaphragm 10 is cut out to form a recess 53. A supporting portion 52 is fixed to a casing 51 by means of adhesive agent 50 and the thickness of the supporting portion is greater than that of a pressure-receiving portion 54.

When a pressure P is applied to such a disc-shaped diaphragm as described above, the diaphragm undergoes distortion so that the respective strain gauge units are subjected to strains. The strains cause in turn the changes in the internal resistances of the strain gauge units due to piezoresistance effect. Namely, positive resistance changes take place in, for example, the radial strain gauge units 11 and 12 while negative resistance changes occur in, for example, the tangential strain gauge units 13 and 14. Since these strain gauge units are electrically connected in a bridge circuit configuration, an electric signal proportional to the pressure P can be obtained from the output terminals of the bridge.

Now, the performance of such a pressure transducer a diaphragm type using strain gauges described above will be described on the basis of experimental data. For example, for measurement of a pressure of 5 kg/cm², a silicon diaphragm with radial and tangential strain gauge units was fabricated as follows. The pressure-responsive section of the diaphragm has a thickness of 0.2 mm and a diameter of 8 mm. The distance $X_R$ from the center of the circular diaphragm to the radial strain gauge units on the pressure responsive section is such that $X_R = 3.2$ mm or r/s = 0.8 and the distance $X_T$ from the same center to the tangential strain gauge units is such that $X_T = 0.8$ mm or r/s = 0.2, where r is the distance from the center of the circular diaphragm to the strain gauge unit and s is the radius of the circular diaphragm. When the bridge was so energized by a constant current that the voltage of 3.5 V is applied across the input terminals, then the output voltage sensitivity was 200±20 mV (full scale) per 5 kg/cm² with non-linearity of −0.1% of the full scale and temperature influence on non-linearity of 0.1% ∼ −0.2% of the full scale within a temperature range of −40°C. ∼ 120°C. This means that the non-linearity characteristic is improved by the pressure gauge of the present invention to about one-third of that of the conventional pressure gauge in which the radial and tangential strain gauge units are disposed at almost the same distance from the diaphragm center, i.e. $X_R \approx X_T$ as described in more detail hereinafter. In another example, a silicon diaphragm with a thickness of 0.8 mm and a diameter of 8 mm was fabricated for the measurement of a pressure of 100 kg/cm², in which $X_R = 3.2$ mm (r/s = 0.8) and $X_T = 1.8$ mm (r/s = 0.45). When the bridge was so energized by a constant current that the voltage of 3.5 V is applied across the input terminals then the non-linearity and temperature influence characteristics were substantially the same as those obtained in the previous measurement of the pressure of 5 kg/cm².

Thus, the disc-shaped diaphragm shown in FIG. 1 has an excellent feature that improved characteristics can be obtained by merely changing the thickness of the pressure-responsive portion depending on the pressure to be measured.

The energization of the bridge circuit is not limited to the constant current mode. Excellent non-linearity characteristics are obtained by constant voltage energization if the distance $X_T$ is slightly changed.

It should be noted that the basic structure of the pressure gauge is not different depending on whether the bridge circuit of strain gauge units is energized in the constant current mode or the constant voltage mode.

Figure 4:
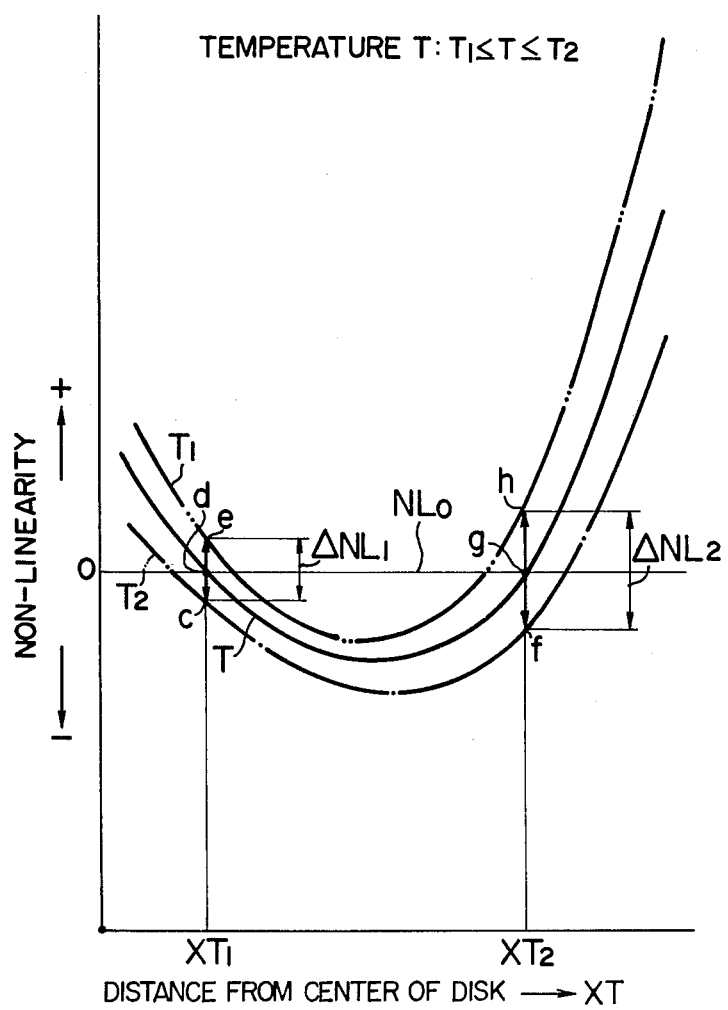
FIG. 4 shows characteristics illustrating the relationship between the non-linearity and the distance from the center of the diaphragm to the tangential strain gauge unit, in the case where the radial strain gauge unit is fixed in the peripheral portion of the diaphragm, with temperature varied as a parameter.

FIG. 4 shows in graphical representation how the ambient temperature variation affects non-linearity characteristics of the strain gauge. In FIG. 4, the abscissa XT and the ordinate respectively represent the distance from the center of the circular diaphragm to the tangential strain gauge unit and the value of non-linearity NL, as defined before. The point 0 on the ordinate indicates that the non-linearity is zero at that point, and $NL_o$ stands for a straight line on which the non-linearity is zero. In the plotting of this characteristics, the radial strain gauge units are fixed to certain positions on the peripheral portion of the circular diaphragm, the ambient temperature is taken as a parameter assuming discrete values $T_1$, T and $T_2$, and the non-linearity is measured at various values of the distance from the center of the circular diaphragm to the tangential strain gauge unit, while maintaining the ambient temperature at one of $T_1$, T and $T_2$ where $T_1 \leq T \leq T_2$.

As seen from FIG. 4, there are two points on the diaphragm where the non-linearity becomes zero at a given ambient temperature T. One of such points is a point $XT_1$ corresponding to the point d where the curve for T first intersects the straight line $NL_o$ when the distance XT increases progressively from a smaller value, and the other is a point $XT_2$ corresponding to the point g where the curve for T secondly cuts the line $NL_o$, the point $XT_1$ being nearer to the center and the point $XT_2$ being nearer to the periphery.

In view of the sensitivity of the strain gauge units, it is preferable to choose the point $XT_2$ for location of the strain gauge unit. In the prior art including U.S. Pat. No. 4,050,313, the tangential strain gauge units are disposed at those points corresponding to the distance $XT_2$ and near to the locations of the radial strain gauge units.

As seen from FIG. 4, however, if the ambient temperature shifts from $T_1$ to $T_2$, the non-linearity at the point $XT_2$ changes from f to h, i.e. over a variation of $\Delta NL_2$, while the non-linearity at the point $XT_1$ changes from c to d, i.e. over a variation of $\Delta NL_1$. It should be noted that the variation of the non-linearity at $XT_2$ is considerably greater than that at $XT_1$. Therefore, if the change in the ambient temperature is taken into consideration, the tangential strain gauges should be disposed at points corresponding to the distance $XT_1$.

Figure 5:
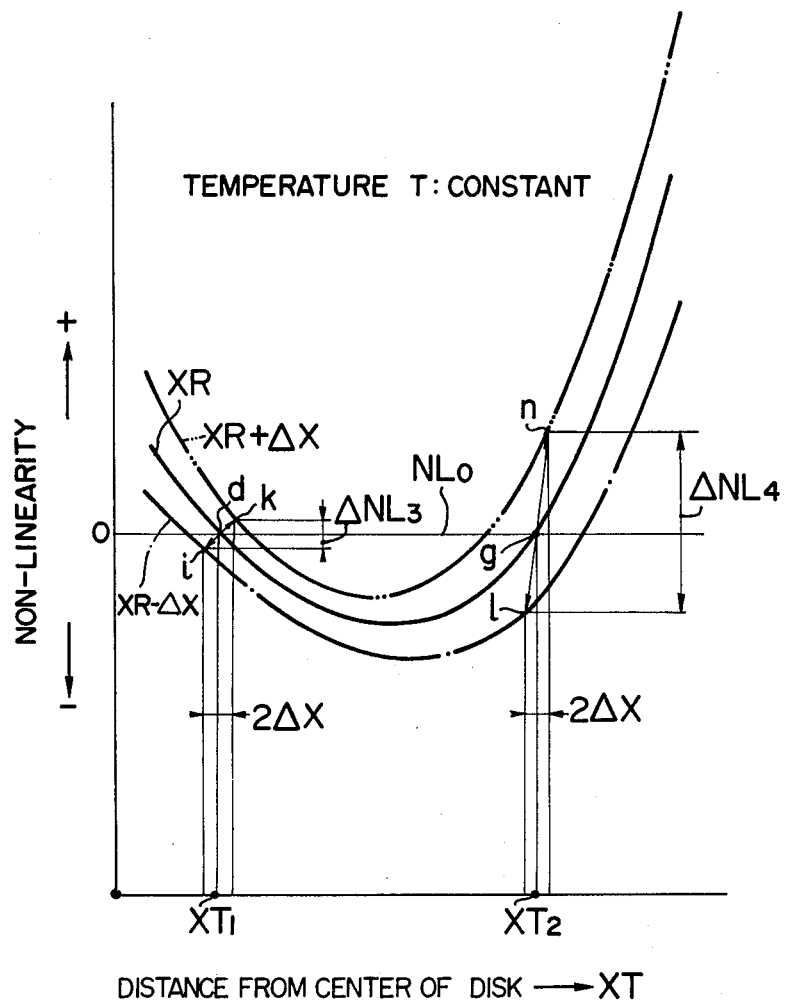
FIG. 5 shows characteristics illustrating the relationship between the non-linearity and the distance from the center of the diaphragm to the tangential strain gauge unit, in the case where the radial strain gauge unit is disposed in the peripheral portion of the diaphragm and the ambient temperature is kept constant, with the position of the radial strain gauge unit changed as a parameter.

Now explanation will be made, with reference to FIG. 5, as to which of $XT_1$ and $XT_2$ is preferable for location of the tangential strain gauge unit in view of a problem of deviation in location of the strain gauge unit which may occur during the process of formation of the recess at the rear side of the diaphragm. In FIG. 5 the same reference symbols indicate like elements in FIG. 4. FIG. 5 shows how the non-linearity characteristics change when the location of the tangential strain gauge is changed $\pm \Delta X$ about the position $XT_1$ or $XT_2$ and the location of the radial strain gauge disposed in the peripheral portion of the diaphragm is simultaneously changed by the same distance, while maintaining the ambient temperature constant.

In FIG. 5, a curve XR corresponds to the curve T in FIG. 4, a curve $XR-\Delta X$ represents the non-linearity characteristics in the case where the radial strain gauge unit is displaced by $-\Delta X$ from its location corresponding to the curve XR, and a curve $XR+\Delta X$ in the case where the radial strain gauge unit is displaced by $+\Delta X$ from the same.

Now, if the tangential strain gauge unit disposed at the point corresponding to $XT_1$ and the radial strain gauge deviate in position simultaneously over a range of $2\Delta X$, the associated characteristic shifts over a range from i to k. In like manner, if the tangential strain gauge unit disposed at the point corresponding to $XT_2$ and the radial strain gauge unit deviate in position simultaneously over a range of $2\Delta X$, the associated characteristic shifts over a range from l to n. The slope of the line ln is greater than that of the line ik and the variation of the non-linearity $\Delta NL_4$ is greater than that of the non-linearity $\Delta NL_3$. Accordingly, it is preferable to dispose the tangential strain gauge units at positions corresponding to the distance $XT_1$ either taking in consideration of the deviation in positioning during the formation of the recess.

In FIGS. 4 and 5 are shown the cases where the curve representing the relationship between the distance from the center of the circular diaphragm to the tangential strain gauge unit and the value of non-linearity intersects the straight line representing the non-linearity being zero at two points. However, there is also a case where the curve is in contact with the straight line at only one point. In this case, it is necessary to dispose the tangential strain gauge units at positions corresponding to the point of contact.

Figure 6:
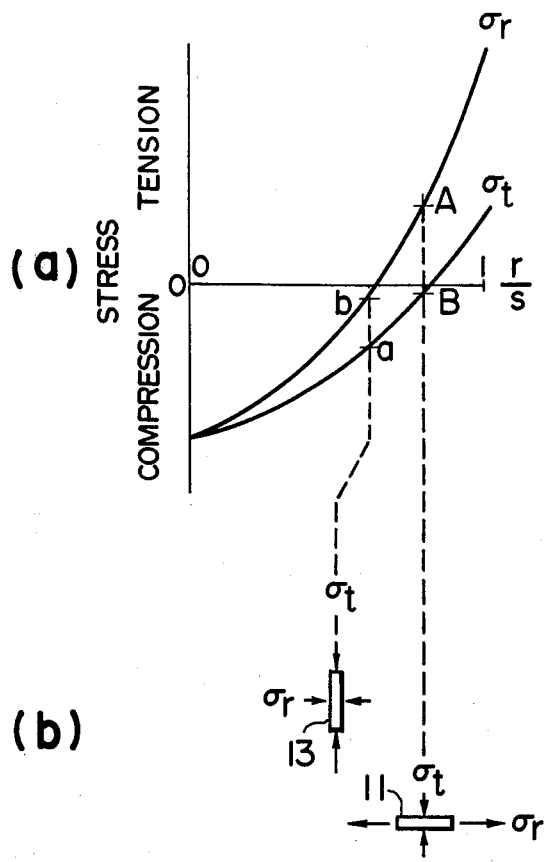
FIG. 6 shows the distribution of the stress in the surface of the diaphragm.
Figure 7:
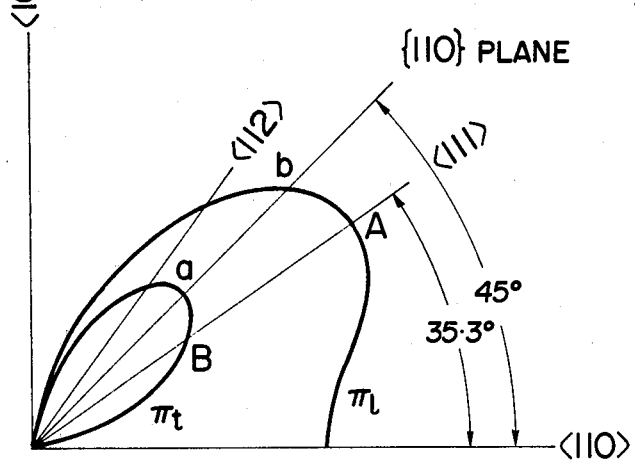
FIG. 7 shows the distribution of the piezoresistance coefficient of a p-type strain gauge unit formed in the {110} plane of the single crystal silicon diaphragm.

FIGS. 6 and 7 illustrate how a semiconductor pressure transducer has a high output sensitivity, a uniform characteristic and an excellent linearity when it is constructed as shown in FIG. 1.

FIG. 6(b) shows the positional relationship between the strain gauge units 11 and 13 as disposed on the disc-shaped diaphragm shown in FIG. 1. If the supporting portion 52 of the diaphragm is rigidly fixed to the casing 51 as shown in FIG. 1, the strain gauge units 11 and 13 on the diaphragm undergoes surface stress as shown in FIG. 6(a). The piezoresistance coefficient, which is the sensitivity coefficient of the strain gauges 11 and 13, changes as shown in FIG. 7.

In FIG. 6(a), the abscissa represents the ratio of the distance r between the center of the circular diaphragm and the gauge unit position to the radius s of the circular diaphragm, and the ordinate denotes stress, the points 0 and 1 respectively corresponding to the center and the outer boundary of the circular diaphragm. The stresses in the radial and the tangential directions are represented respectively by $\sigma_r$ and $\sigma_t$.

The bending stresses $\sigma_r$ and $\sigma_t$ are given by the expressions below.

$$\sigma_r = \tfrac{3}{8}(a/h)^2 [(1+\nu) - \gamma^2(3+\gamma)] P \quad (2)$$

$$\sigma_t = \tfrac{3}{8}(a/h)^2 [(1+\nu) - \gamma^2(1+3\gamma)] P \quad (3)$$

where $\nu = r/a$, a is the radius of the pressure-responsive portion of the diaphragm, h is the thickness of the pressure-responsive portion of the diaphragm, $\gamma$ is the Poisson's ratio, and P is the pressure applied thereto.

The abscissa and the ordinate in FIG. 7 are respectively corresponding to the $<110>$ and $<100>$ crystal axes passing through the center of the surface of the circular diaphragm having a $\{100\}$ plane, and $\pi_l$ and $\pi_t$ respectively indicate the piezoresistance coefficients in the longitudinal and the transverse directions. These coefficients have opposite signs to each other.

The relationship between the radius and the rate of change in the resistance of the gauge is approximately described by the following expression:

$$(\Delta R/R)_r = \pi_l \sigma_r + \pi_t \sigma_t \quad (4)$$

where $\pi_l$ is the piezoresistance coefficient in the longitudinal direction, $\pi_t$ the piezoresistance coefficient in the transverse direction, $\sigma_r$ the stress in the radial direction and $\sigma_t$ the stress in the tangential stress.

In like manner, concerning the tangential strain gauge units arranged in the tangential direction, it follows that $$(\Delta R/R)_t = \pi_l \sigma_t + \pi_t \sigma_r \quad (5)$$

Since according to the expressions (2) and (3) the stresses $\sigma_r$ and $\sigma_t$ change their magnitudes depending on distance between the diaphragm center and the strain gauge unit positions, the resistance of each gauge unit should change depending on the distance from the diaphragm.

As seen from FIG. 7, the radial strain gauge exhibits the maximum value of its longitudinal piezoresistance coefficient $\pi_l$ at location along the $<111>$ axis passing through the center of the circular diaphragm while the tangential strain gauge exhibits the maximum value of its transverse piezoresistance coefficient $\pi_t$ at location along an axis passing through the center of the circular diaphragm and making an angle of 45° with both the $<110>$ and $<100>$ axes. Moreover, the thus selected positions corresponding to the flex points on the curves of $\pi_l$ and $\pi_t$, respectively, the deviation, in resistance due to wrong angular positioning is small.

More particularly, the points A and B in FIG. 7 correspond to the first and second terms of the equation (4), respectively, when applied to the radial strain gauge, while the points a and b correspond to the first and second terms of the equation (5), respectively, when applied to the tangential strain gauge. The inventors of the present application have previously studied the performance of a strain gauge unit upon application of uniaxial stress and found that the non-linearity with or without temperature variation becomes greater when the radial and tangential strain gauge units are subjected to transverse uniaxial stresses, respectively, than when they are subjected to longitudinal uniaxial stresses. It will be seen, from this fact, that the non-linearities of the radial and tangential strain gauges as disposed in the positional relationship shown in FIG. 6(b) become smaller when both of the strain gauge are so positioned that they are mainly subjected to longitudinal stresses and hence the performance of the strain gauges is predominantly subjected to the first term of the equations (4) and (5).

It will be, therefore, understood that the radial strain gauge should be disposed at a position which is on the $<111>$ axis and where the tangential stress $\sigma_t$ applied thereto is almost zero, i.e. $\sigma_t \approx 0$, while the tangential strain gauge should be disposed at a position which is on an axis making an angle of 45 degrees with the $<110>$ and $<100>$ axes and nearer to the center of the diaphragm than the radial strain gauge and where the radial stress $\sigma_r$ applied thereto is almost zero, i.e. $\sigma_r \approx 0$, in order to make smaller the value of the non-linearity of each strain gauge with or without the ambient temperature variation. However, it should be noted that when the rates of resistance change, as given by the equations (4) and (5), of the radial and tangential strain gauge units are different from each other, the optimum positions for the minimum non-linearity of the respective strain gauge units do not necessarily meet their optimum positions for the minimum non-linearity of the output of the bridge circuit of the gauge units constituting a pressure transducer. In the embodiment of FIG. 1, the strain gauge units are disposed by taking the above matter in consideration. Thus, it is required to determine the position of the tangential strain gauge unit on the basis of the principle of this invention, in order to compensate for the non-linearity due to the change of ambient temperature.

The strain gauge of diaphragm type shown in FIG. 1 can enjoy the following meritorious effects.

(1) Since both the radial strain gauge units and the tangential strain gauge units are disposed along the crystallographic axes which give the maximum sensitivity of the P-type strain gauge, the large changes in resistance become possible so that a high output sensitivity can be obtained.

(2) The radial and tangential strain gauge units are disposed at positions which give the maximum sensitivity and the non-linearity due to the change in ambient temperature can be easily compensated by simply controlling the positions at which the tangential strain gauge units are to be disposed.

Further the effects of the present invention are obtained by an arrangement, as seen from FIG. 7, such that the allowable angular deviation for the radial strain gauge units disposed on the $<111>$ axis is within a range of about $\pm 10°$ from the point A, and the allowable angular deviation for the tangential strain gauge units disposed on the axis making an angle of 45° with the $<110>$ axis is within a range of about $\pm 10°$ from the point a. Accordingly, such a difficulty as precision in the arrangement of the strain gauge units can be eliminated.

(3) It is possible to make small the variation of non-linearity due to deviation of the strain gauge units in relative position to the recess formed at the rear side of the diaphragm. Thus, it is possible to manufacture the products having uniform characteristics even by mass-production.

(4) Since both the radial and tangential strain gauge units are disposed at the positions corresponding to the flex points on the sensitivity curves, the unevenness of the sensitivity due to the deviations of the crystallographic axes can be reduced to a very small degree so that the reproductivity of uniform characteristic can be improved.

(5) The strain gauge units are disposed, as shown in FIG. 1, such that there exist four strain gauge units in each quadrant of the circular diaphragm which gauge units, for example, the gauge units 11, 12, 13, and 14 in the first quadrant, are connected in a bridge configuration adapted to be used as a pressure transducer. Thus, if a gauge pattern is made to include different four combinations of radial and tangential strain gauges which are capable of being used for different pressure ranges, it is possible to make four different types of pressure gauges by using only the above-mentioned gauge pattern.

The application of the principle of this invention is not limited to the diaphragm shown in FIG. 1, but, for example, the disc-shaped diaphragm may be made of N-type silicon and have its pressure-responsive surface coincident with a $\{11\}$ plane. Since the $\{111\}$ plane has an isotropic property, the directions of the arrangement of the strain gauge units may be arbitrarily chosen and if the positions of the strain gauge units are determined according to the principle of this invention, the non-linearity depending on the change in ambient temperature can be easily compensated.

Other preferable embodiments to which the principle of this invention can be applied, will be listed as follows.

| No. | Strain gauge material | Pressure-responsive surface | Radial direction axis | Tangential direction axis |
|---|---|---|---|---|
| 1 | P-type Si | $\{110\}$ | $<110>$ | $<100>$ |
| 2 | P-type Si | $\{211\}$ | $<111>$ or $<011>$ | $<111>$ or $<011>$ |
| 3 | P-type Si | $\{110\}$ | $<110>$ | Axis making an angle of 45° with $<110>$ or $<100>$ |
| 4 | P-type Si | $\{110\}$ | $<111>$ | $<112>$ |

As described above, according to this invention, the non-linearity due to the change in the ambient temperature can be so easily compensated that a semiconductor pressure transducer having a very wide range of operating temperatures can be obtained.

We claim:

1. A semiconductor pressure transducer comprising:
   (a) a disc-shaped diaphragm of single crystal semiconductor material;
   (b) at least one radial strain gauge unit having a piezoresistance effect, formed in the radial direction in said disc-shaped diaphragm;
   (c) at least one tangential strain gauge unit having a piezoresistance effect, formed in the tangential direction of said disc-shaped diaphragm;
   (d) a supporting base for supporting the outer peripheral portion of said disc-shaped diaphragm, wherein said radial strain gauge unit is disposed near the peripheral portion of said disc-shaped diaphragm, and said tangential strain gauge unit is disposed in the position near the point where a curve representing the relationship between the non-linearity and the distance from the center of said diaphragm to said tangential strain gauge unit, first intersects the straight line on which the non-linearity is substantially.

2. A semiconductor pressure transducer as claimed in claim 1, wherein
said disc-shaped diaphragm is made of N-type silicon, with its pressure-responsive surface coincident with a {110} plane;
said radial strain gauge unit is of P-type and disposed along a <111> axis; and
said tangential strain gauge unit is of P-type and disposed perpendicularly to the axial direction making an angle of 45° with <110> and <100> axes.

3. A semiconductor pressure transducer as claimed in claim 1, wherein
said disc-shaped diaphragm is made of N-type silicon with its pressure-responsive surface coincident with a {111} plane and
said gauge units are of P-type.

4. A semiconductor pressure transducer comprising:
(a) a disc-shaped diaphragm of single crystal semiconductor material;
(b) at least one pair of radial strain gauge units having a piezoresistance effect formed in the radial direction in each quadrant of said disc-shaped diaphragm;
(c) at least one pair of tangential strain gauge units having a piezoresistance effect formed in the tangential direction in each quadrant of said disc-shaped diaphragm;
(d) a supporting base for supporting the outer peripheral portion of said disc-shaped diaphragm;
wherein in each quadrant of said disc-shaped diaphragm said pair of radial strain gauge units is disposed near the peripheral portion and at positions symmetrical with respect to a radial axis and wherein in said quadrant
said pair of tangential strain gauge units is disposed nearer to the center of said diaphragm than the pair of radial strain gauge units therein and at positions symmetrical with respect to said radial axis.

5. A semiconductor pressure transducer comprising:
(a) a disc-shaped diaphragm of single crystal semiconductor material;
(b) at least one pair of radial strain gauge units having a piezoresistance effect formed in the radial direction in each quadrant of said disc-shaped diaphragm;
(c) at least one pair of tangential strain gauge units having a piezoresistance effect formed in the tangential direction in each quadrant of said disc-shaped diaphragm;
(d) a supporting base for supporting the outer peripheral portion of said disc-shaped diaphragm;
wherein in each quadrant of said disc-shaped diaphragm said pair of radial strain gauge units is disposed near the peripheral portion and at positions symmetrical with respect to a radial axis and wherein in each quadrant
the tangential strain gauge units of said pair are disposed near the positions corresponding to the point where a curve representing the relationship between the non-linearity and the distance from the center of said diaphragm to said tangential strain gauge units, first intersects the straight line on which the nonlinearity is substantially zero, and at positions symmetrical with respect to the radial axis.

6. A semiconductor pressure transducer as claimed in claim 4 or 5, wherein
the distance from the center of said diaphragm to a pair of tangential strain gauge units in at least one of the four quadrants each having a pair of tangential strain gauge units, is made different from the distance from said center to a pair of tangential strain gauge units in another quadrant.

7. A semiconductor pressure transducer as claimed in claim 6, wherein
each of said radial strain gauge units comprises plural parallel strip portions,
each of said tangential strain gauge units comprises plural parallel strip portions, and
said strip portions are connected in series by low-resistance connecting portions.

8. A semiconductor pressure transducer comprising:
(a) a disc-shaped diaphragm of single crystal semiconductor material;
(b) at least one radial strain gauge unit having a piezoresistance effect, formed in the radial direction in said disc-shaped diaphragm;
(c) at least one tangential strain gauge unit having a piezoresistance effect, formed in the tangential direction of said disc-shaped diaphragm;
(d) a supporting base for supporting the outer peripheral portion of said disc-shaped diaphragm, wherein said radial strain gauge unit is disposed near the peripheral portion of said disc-shaped diaphragm and said tangential strain gauge unit is disposed nearer to the center of said diaphragm than said radial strain gauge unit; and wherein
said disc-shaped diaphragm is made of N-type silicon, with its pressure-responsive surface coincident with a {110} plane;
said radial strain gauge unit is of P-type and disposed along a <111> axis; and
said tangential strain gauge unit is of P-type and disposed perpendicularly to the axis direction making an angle of 45° with <110> and <100> axes.

* * * * *